United States Patent
Kao

(10) Patent No.: US 7,190,014 B2
(45) Date of Patent: Mar. 13, 2007

(54) VERTICALLY-STACKED PLATE INTERDIGITAL CAPACITOR STRUCTURE

(75) Inventor: Ching-Hung Kao, Hsin-Chu Hsien (TW)

(73) Assignee: United Microelectronics Corp., Hsin-Chu (TW)

(*) Notice: Subject to any disclaimer, the term of this patent is extended or adjusted under 35 U.S.C. 154(b) by 115 days.

(21) Appl. No.: 10/904,825

(22) Filed: Dec. 1, 2004

(65) Prior Publication Data

US 2006/0113630 A1   Jun. 1, 2006

(51) Int. Cl.
*H01L 29/94* (2006.01)

(52) U.S. Cl. ..................................... 257/303

(58) Field of Classification Search ............... 438/253; 257/303
See application file for complete search history.

(56) References Cited

U.S. PATENT DOCUMENTS 6,528,366 B1 * 3/2003 Tu et al. .................... 438/253

* cited by examiner

*Primary Examiner*—Carl Whitehead, Jr.
*Assistant Examiner*—Monica D. Harrison
(74) *Attorney, Agent, or Firm*—Winston Hsu

(57) ABSTRACT

A vertically-stacked interdigital plate capacitor structure includes at least a first conductive plate, at least a second conductive plate parallel to the first conductive plate, and an inter-metal dielectric layer disposed between the first conductive plate and the second conductive plate. The first conductive plate includes a plurality of first conductive bars vertically stacked, each first conductive bar is electrically connected to the first conductive bar positioned thereunder by a plurality of first conductive vias, and each first conductive via has a rectangular shape. The second conductive plate includes a plurality of second conductive bars vertically stacked, each second conductive bar is electrically connected to the second conductive bar positioned thereunder by a plurality of second conductive vias, each second conductive via has a rectangular shape, and each second conductive via is corresponding to and parallel to each first conductive via.

16 Claims, 4 Drawing Sheets

VERTICALLY-STACKED PLATE INTERDIGITAL CAPACITOR STRUCTURE

BACKGROUND OF INVENTION

1. Field of the Invention

The present invention relates to a vertically-stacked plate interdigital capacitor structure, and more particularly, to a vertically-stacked plate interdigital capacitor structure having a plurality of rectangular metal vias.

2. Description of the Prior Art

Various capacitor structures are used as electronic elements in integrated circuits such as radio frequency integrated circuits (RFIC), and monolithic microwave integrated circuits (MMIC). Such capacitor structures include, for example, metal-oxide-semiconductor (MOS) capacitors, p-n junction capacitors and metal-insulator-metal (MIM) capacitors. For some applications, MIM capacitors can provide certain advantages over MOS and p-n junction capacitors because the frequency characteristics of MOS and p-n junction capacitors may be restricted as a result of depletion layers that form in the semiconductor electrodes. An MIM capacitor can exhibit improved frequency and temperature characteristics. Furthermore, MIM capacitors are formed in the metal interconnect layers, thereby reducing transistor process integration interactions or complications.

Please refer to FIG. 1, which is a schematic diagram of a conventional MIM capacitor structure 10. As shown in FIG. 1, the conventional MIM capacitor structure 10 includes a lower metal plate 12, an upper metal plate 14 positioned over the lower metal plate 12, and an inter-metal dielectric layer 16 disposed in between the lower metal plate 12 and the upper metal plate 14. Since the capacitance of the MIM capacitor structure 10 is directly proportional to the area of the lower metal plate 12 and the upper metal plate 14, the area of the MIM capacitor structure 10 must be maintained in a large scale so as to increase the capacitance. As shown in FIG. 1, the lower metal plate 12 and the upper metal plate 14 are overlapped, and the horizontal planar area between the lower metal plate 12 and the upper metal plate 14 is very large. However, due to the requirements of electronic device miniaturization, the size of the MIM capacitor structure 10 becomes a problem in diminishing the overall size of the electronic devices. Therefore, a new capacitor structure, which has a smaller size but possesses a large capacitance, is beneficial for the fabrication of miniature electronic devices.

SUMMARY OF INVENTION

It is therefore a primary object of the claimed invention to provide a vertically-stacked interdigital plate capacitor structure to overcome the aforementioned problem.

According to the claimed invention, a vertically-stacked interdigital plate capacitor structure is disclosed. The vertically-stacked interdigital plate capacitor structure includes at least a first conductive plate, at least a second conductive plate parallel to the first conductive plate, and an inter-metal dielectric layer disposed between the first conductive plate and the second conductive plate. The first conductive plate includes a plurality of first conductive bars vertically stacked, each first conductive bar is electrically connected to the first conductive bar positioned thereunder by a plurality of first conductive vias, and each first conductive via has a rectangular shape. The second conductive plate includes a plurality of second conductive bars vertically stacked, each second conductive bar is electrically connected to the second conductive bar positioned thereunder by a plurality of second conductive vias, each second conductive via has a rectangular shape, and each second conductive via is corresponding to and parallel to each first conductive via.

Since the first conductive plate and the second conductive plate of the present invention are vertical and aligned in parallel, the top area of the vertically-stacked interdigital plate capacitor structure is very small compared to the conventional MIM capacitor structure. In addition, both of the first conductive plate and the second conductive plate are composed of a plurality of vertically-stacked conductive bars, and each conductive bar is electrically connected to the conductive bar positioned thereunder by a plurality of rectangular conductive vias. Due to the rectangular shape of the conductive vias, the area between the first conductive plate and the second conductive plate is substantially equal to the area between the lower metal plate and the upper metal plate of the conventional MIM capacitor. Thus, the capacitance of the vertically-stacked interdigital plate capacitor structure is large, while the top surface of the vertically-stacked interdigital plate capacitor structure is relatively small.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
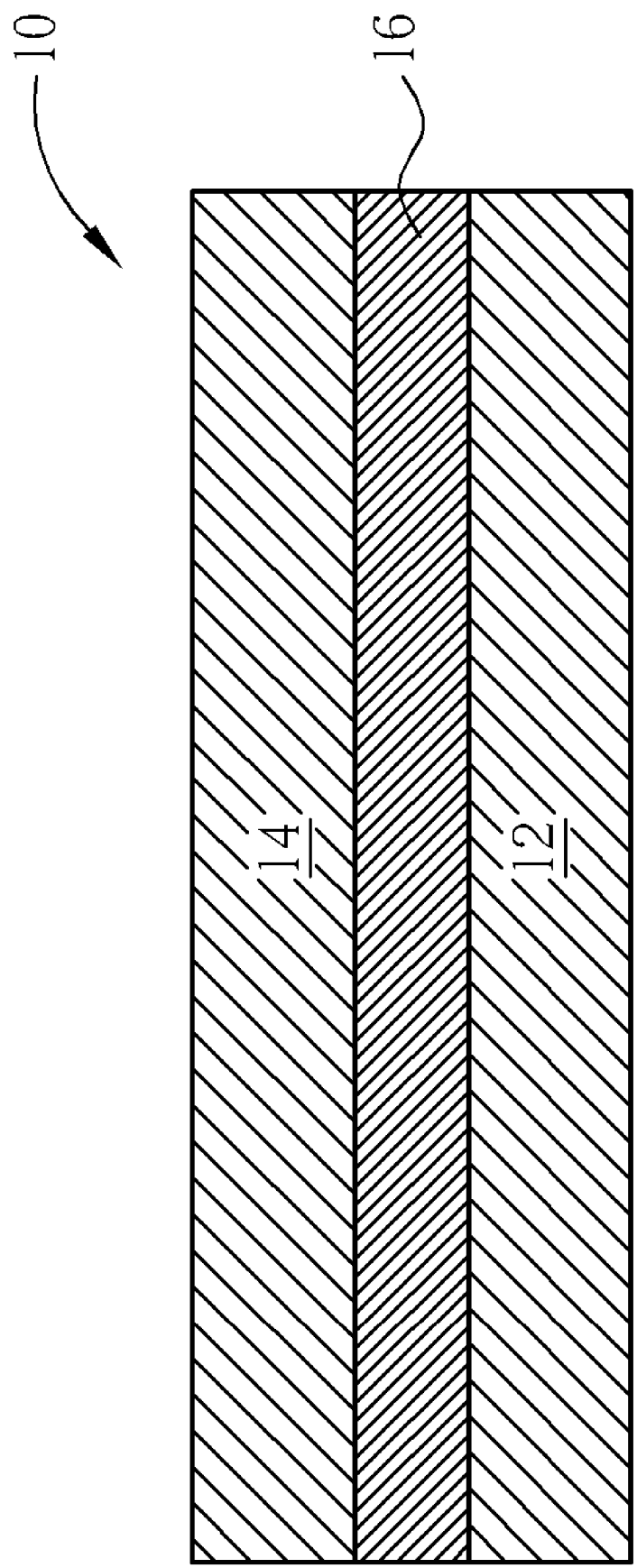
FIG. 1 is a schematic diagram of a conventional MIM capacitor structure.
Figure 2:
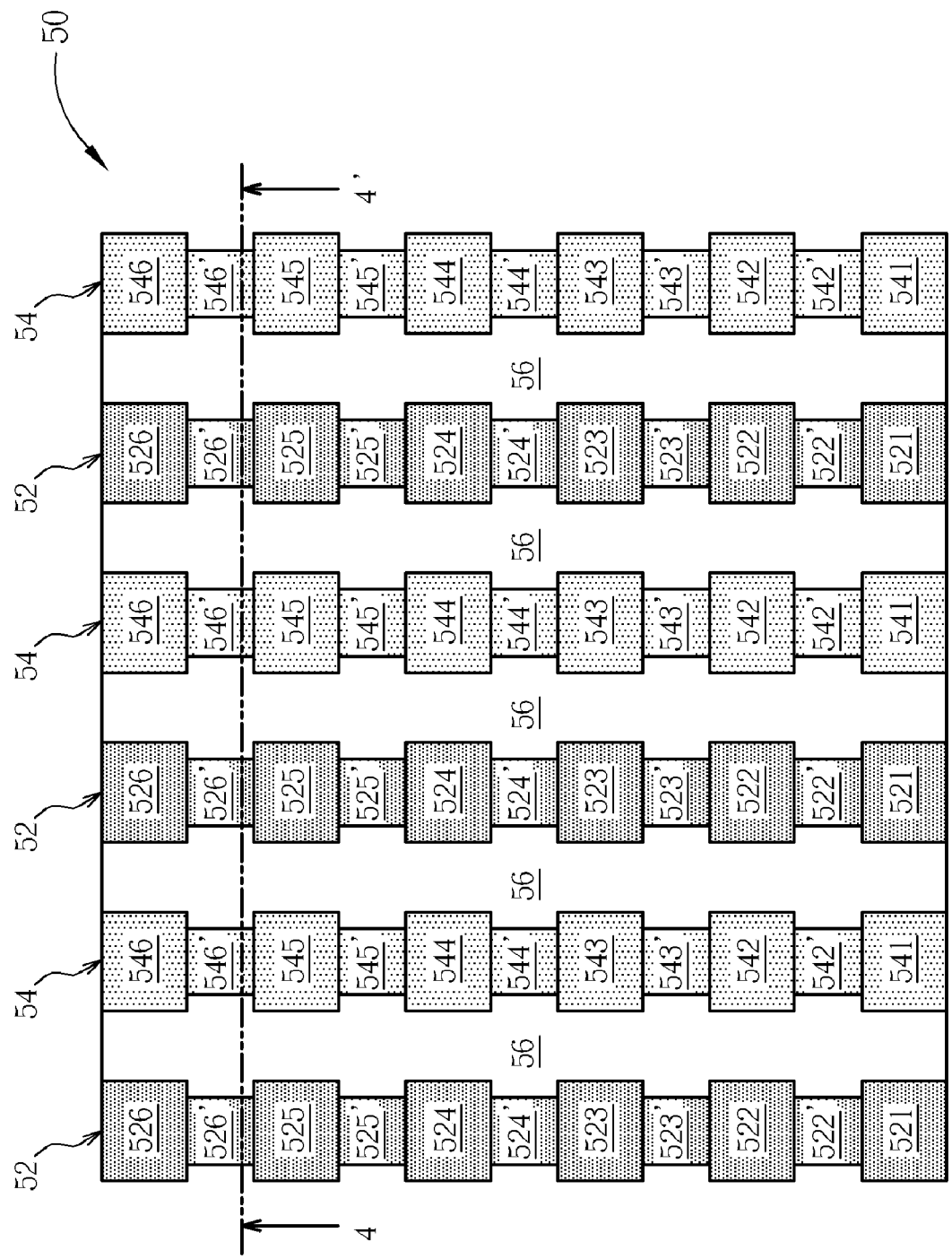
FIG. 2 is a front view of a vertically-stacked interdigital plate capacitor structure according to the present invention.
Figure 3:
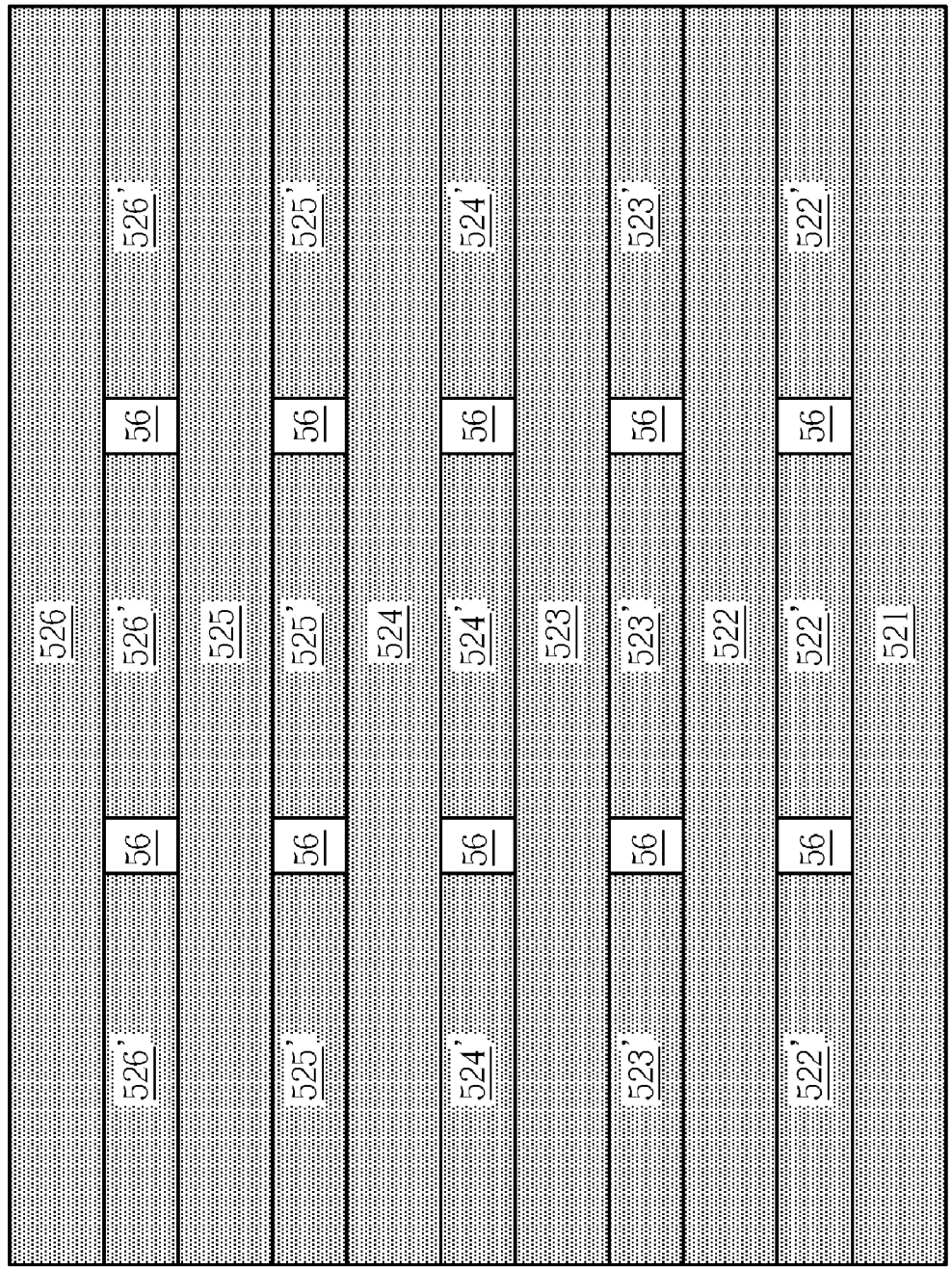
FIG. 3 is a side view of the vertically-stacked interdigital plate capacitor structure shown in FIG. 2.
Figure 4:
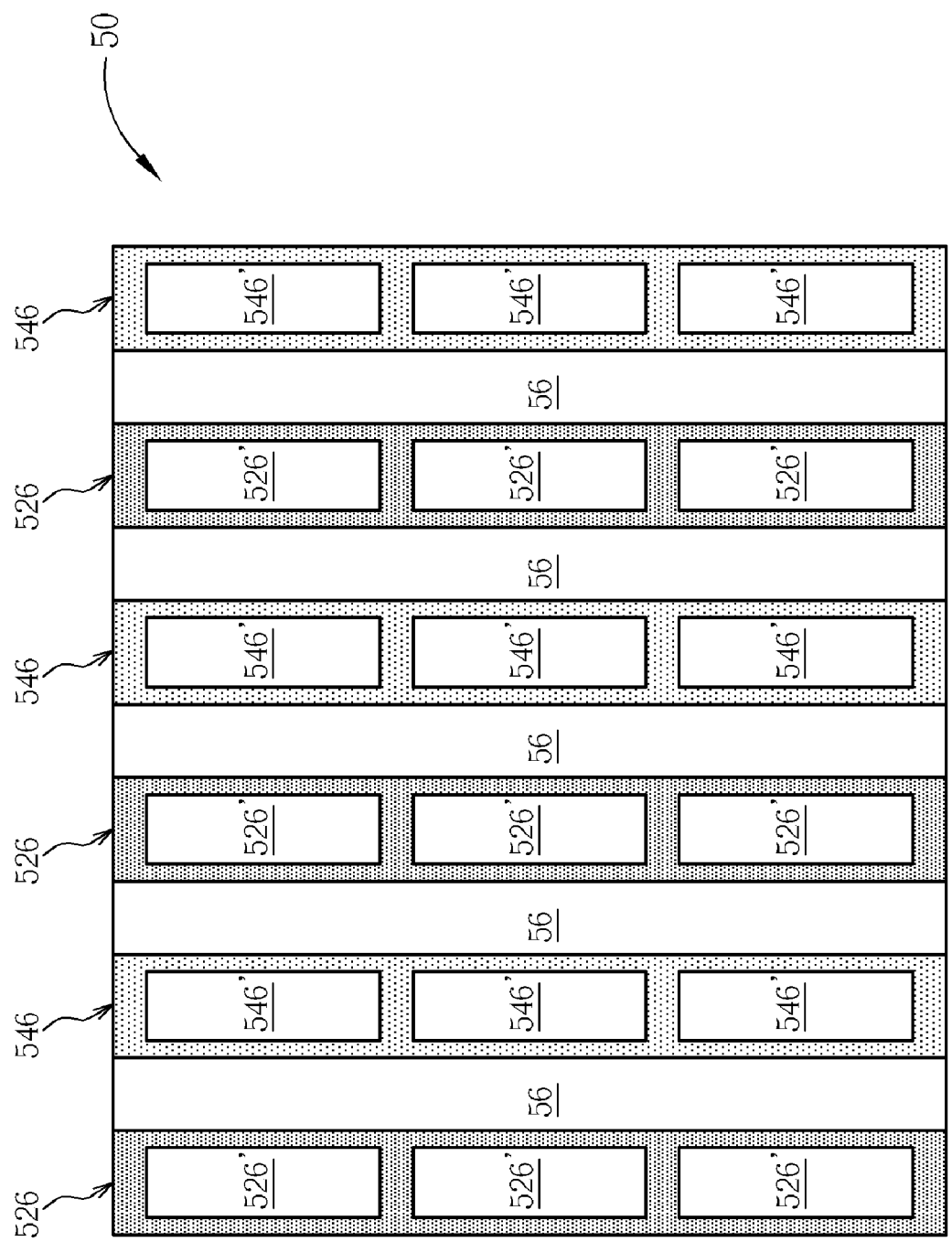
FIG. 4 is a cross-sectional view of the vertically-stacked interdigital plate capacitor structure shown in FIG. 2.

Please refer to FIG. 2 through FIG. 4. FIG. 2 is a front view of a vertically-stacked interdigital plate capacitor structure 50 in accordance with a preferred embodiment of the present invention, FIG. 3 is a side view of the vertically-stacked interdigital plate capacitor structure 50 shown in FIG. 2 where only a portion of the vertically-stacked interdigital plate capacitor structure 50 is shown, and FIG. 4 is a cross-sectional view of the vertically-stacked interdigital plate capacitor structure 50 along the tangent line 44' in FIG. 2. As shown in FIG. 2 through FIG. 4, the vertically-stacked interdigital plate capacitor structure 50 includes at least a first conductive plate (mostly a metal plate) 52, at least a second conductive plate (mostly a metal plate) 54 parallel to the first conductive plate 52, and an inter-metal dielectric (IMD) layer 56 disposed between the first conductive plate 52 and the second conductive plate 54. The first conductive plate 52 and the second conductive plate 54 are respectively made up by stacking a plurality of first conductive bars and a plurality of second conductive bars. In this embodiment, the first conductive plate 52 includes six first conductive bars 521, 522, 523, 524, 525, and 526 from bottom to top, and the second conductive plate 54 includes six second conductive bars 541, 542, 543, 544, 545, and 546 from bottom to top. Normally, the first conductive bars 521, 522, 523, 524, 525, and 526, and the second conductive bars 541, 542, 543, 544, 545, and 546 are composed of metal, and therefore the fabrication of both the first conductive bars 521, 522, 523, 524, 525, and 526, and the second conductive bars 541, 542, 543, 544, 545, and 546 is incorporated with, but not limited to be, a metal interconnection process.

The first conductive plate 52 includes a plurality of first conductive vias 522', 523', 524', 525', and 526' formed between the first conductive bars 521, 522, 523, 524, 525, and 526. For example, the first conductive vias 522' are positioned between the first conductive bars 521 and 522 to electrically connect the first conductive bars 521 and 522. The second conductive plate 54 also includes a plurality of second conductive vias 542', 543', 544', 545', and 546' for electrically connecting the second conductive bars 541, 542, 543, 544, 545, and 546. It should be appreciated that each of the first conductive vias 522', 523', 524', 525', and 526', and each of the second conductive vias 542', 543', 544', 545', and 546' has a rectangular shape as shown in FIG. 4. In addition, each first conductive via, e.g. the first conductive via 522', is corresponding to and parallel to each second conductive via, e.g. the second conductive via 542'. In this embodiment, the length-to-width ratio of each of the first conductive vias 522', 523', 524', 525', and 526', and each of the second conductive vias 542', 543', 544', 545', and 546' is larger than 1, and preferably larger than 1.5 or even larger if practicable in process.

Therefore, with the first conductive bars 521, 522, 523, 524, 525, and 526, and the first conductive vias 522', 523', 524', 525', and 526', the first conductive plate 52 substantially has an entire conducting plane. Similarly, with the second conductive bars 541, 542, 543, 544, 545, and 546, and the second conductive vias 542', 543', 544', 545', and 546', the second conductive plate 54 substantially has an entire conducting plane. In one aspect, the common area of the first conducive plate 52 and the second conductive plate 54 is large which enables the vertically-stacked interdigital plate capacitor structure 50 to have a large capacitance. In another aspect, the area of the top surface of the vertically-stacked interdigital plate capacitor structure 50 is relatively small, which effectively reduces the size of the vertically-stacked interdigital plate capacitor structure 50 without adversely influencing the capacitance.

It should be noted that a main feature of the present invention is the rectangular shape of the conductive vias which enlarge the capacitance. Therefore, other alterations can be made for further enhancing the capacitance. For example, the first conductive bar and the second conductive bar can be complementary zigzag shapes so as to increase the common area of the first conductive plate and the second conductive plate. In addition, quantities of the first conductive plate and the second conductive plate can be increased where necessary. Furthermore, quantities of the first conductive bars and the second conductive bars can also be altered in accordance with the metal interconnection process, or to fulfill a requirement for capacitance.

In comparison with the prior art, the vertically-stacked interdigital plate capacitor structure has a large capacitance while the top area (or total area required) of the vertically-stacked interdigital plate capacitor structure is effective reduced. Consequently, additional miniaturization of electronic devices can be easily facilitated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A vertically-stacked plate interdigital capacitor structure, comprising:
   at least a first conductive plate comprising a plurality of first conductive bars vertically stacked, each first conductive bar being electrically connected to the first conductive bar positioned thereunder by a plurality of first conductive vias, and each first conductive via having a rectangular shape;
   at least a second conductive plate, parallel to the first conductive plate, comprising a plurality of second conductive bars vertically stacked, each second conductive bar being electrically connected to the second conductive bar positioned thereunder by a plurality of second conductive vias, each second conductive via having a rectangular shape, and each second conductive via being corresponding to and parallel to each first conductive via; and
   an inter-metal dielectric (IMD) layer disposed between the first conductive plate and the second conductive plate.

2. The vertically-stacked plate interdigital capacitor of claim 1, wherein the first conductive plate is a metal plate.

3. The vertically-stacked plate interdigital capacitor of claim 1, wherein the second conductive plate is a metal plate.

4. The vertically-stacked plate interdigital capacitor of claim 1, wherein the first conductive via is a metal via.

5. The vertically-stacked plate interdigital capacitor of claim 1, wherein the second conductive via is a metal via.

6. The vertically-stacked plate interdigital capacitor of claim 1, wherein the first conductive via has a length-to-width ratio of larger than 1.

7. The vertically-stacked plate interdigital capacitor of claim 6, wherein the first conductive via has a length-to-width ratio of larger than 1.5.

8. The vertically-stacked plate interdigital capacitor of claim 1, wherein the second conductive via has a length-to-width ratio of larger than 1.

9. The vertically-stacked plate interdigital capacitor of claim 1, wherein the second conductive via has a length-to-width ratio of larger than 1.5.

10. The vertically-stacked plate interdigital capacitor of claim 1, wherein each first conductive via is surrounded by the inter-metal dielectric layer.

11. The vertically-stacked plate interdigital capacitor of claim 1, wherein each second conductive via is surrounded by the inter-metal dielectric layer.

12. A vertically-stacked plate interdigital capacitor structure, comprising:
    a plurality of first metal plates arranged interdigitally, each first metal plate comprising a plurality of metal bars vertically stacked, each metal bar being electrically connected to the metal bar positioned thereunder by a plurality of rectangular metal vias; and
    a plurality of second metal plates arranged interdigitally and alternating with the first metal plates, each second metal plate comprising a plurality of metal bars vertically stacked, each metal bar being electrically connected to the metal bar positioned thereunder by a plurality of rectangular metal vias; and an inter-metal dielectric (IMD) layer disposed between the first metal plates and the second metal plates.

13. The vertically-stacked plate interdigital capacitor of claim 12, wherein each rectangular metal via has a length-to-width ratio of larger than 1.

14. The vertically-stacked plate interdigital capacitor of claim 12, wherein each rectangular metal via has a length-to-width ratio of larger than 1.5.

15. The vertically-stacked plate interdigital capacitor of claim 12, wherein each rectangular metal via of the first metal plates is corresponding to and parallel to each rectangular metal via of the second metal plates.

16. The vertically-stacked plate interdigital capacitor of claim 12, wherein each metal via is surrounded by the inter-metal dielectric layer.

* * * * *